United States Patent
Hsu et al.

(10) Patent No.: US 10,148,101 B2
(45) Date of Patent: Dec. 4, 2018

(54) BATTERY CHARGING SYSTEM AND BATTERY CHARGING PROTECTION CONTROL METHOD

(71) Applicant: MEDIATEK Inc., Hsin-Chu (TW)

(72) Inventors: Chih-Yuan Hsu, Hsinchu (TW); Shih-Ming Chen, Hsinchu (TW); Jia-You Chuang, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/480,417

(22) Filed: Apr. 6, 2017

(65) Prior Publication Data

US 2018/0048166 A1 Feb. 15, 2018

Related U.S. Application Data

(60) Provisional application No. 62/374,038, filed on Aug. 12, 2016.

(51) Int. Cl.
*H02J 7/00* (2006.01)
*G01R 31/36* (2006.01)

(52) U.S. Cl.
CPC .......... *H02J 7/0029* (2013.01); *G01R 31/362* (2013.01); *H02J 7/0072* (2013.01); *H02J 2007/0039* (2013.01)

(58) Field of Classification Search
CPC .................. H02J 7/0029; H02J 7/0072; H02J 2007/0039; G01R 31/362
USPC ................................ 320/107, 128; 361/91.1
See application file for complete search history.

(56) References Cited

U.S. PATENT DOCUMENTS

| | | | | |
|---|---|---|---|---|
| 4,084,206 A | * | 4/1978 | Leowald | H02H 7/12 327/471 |
| 8,154,240 B2 | * | 4/2012 | Negoro | B60L 7/14 180/65.245 |
| 8,994,324 B2 | * | 3/2015 | Nishina | H02J 7/042 320/107 |
| 9,343,917 B2 | | 5/2016 | Yang | |
| 2013/0314095 A1 | * | 11/2013 | Nakashima | G01R 31/3679 324/433 |
| 2017/0005499 A1 | | 1/2017 | Zhang et al. | |

FOREIGN PATENT DOCUMENTS

CN 103762691 B 12/2015

* cited by examiner

*Primary Examiner* — M Baye Diao
(74) *Attorney, Agent, or Firm* — McClure, Qualey & Rodack, LLP

(57) ABSTRACT

A battery charging system for charging a battery of a portable device includes: a power supplier, generating a power supplier output voltage and a power supplier output current; and a charging circuit, dynamically updating an over-voltage protection threshold and/or an over-current protection threshold based on a charging current, a battery cell charging voltage and an equivalent impedance of a charge path. The power supplier output current and/or the over-voltage protection threshold and/or the over-current protection threshold are time-varying during the battery is charged. The power supplier performs over-voltage protection and/or over-current protection based on the over-voltage protection threshold and/or the over-current protection threshold from the charging circuit.

25 Claims, 5 Drawing Sheets

BATTERY CHARGING SYSTEM AND BATTERY CHARGING PROTECTION CONTROL METHOD

This application claims the benefit of U.S. Provisional Patent application Ser. No. 62/374,038, filed Aug. 12, 2016, the disclosure of which is incorporated by reference herein in its entirety.

BACKGROUND

Technical Field

The disclosure relates in general to a battery charging system and a battery charging protection control method.

Description of the Related Art

Currently, electronic devices powered by rechargeable batteries are charged by an external power adapter. When the battery is in charging, in order to shorten the charging time, the charging current may be increased in order to achieve the purpose of charging the battery quickly.

However, in case that a constant voltage (CV) mode is used or the charging current is increased, if the battery charge voltage and/or the battery charge current during charging are too large, then the battery may be damaged due to over voltage and/or over current.

Thus, it needs over-voltage protection and/or over-current protection when the electronic devices having battery is in charging.

SUMMARY

According to one embodiment, provided is a battery charging system for charging a battery of a portable device. The battery charging system includes: a power supplier, being configured for generating a power supplier output voltage and a power supplier output current; and a charging circuit, coupled to the power supplier for receiving the power supplier output voltage and the power supplier output current from the power supplier, the charging circuit dynamically updating an over-voltage protection threshold and/or an over-current protection threshold based on a charging current, a battery cell charging voltage and an equivalent impedance of a charge path, the charge path being from the power supplier to the battery, the charging circuit detecting the battery cell charging voltage which is used for charging the battery. The power supplier output current and/or the over-voltage protection threshold and/or the over-current protection threshold are time-varying during the battery is charged. The power supplier performs over-voltage protection and/or over-current protection based on the over-voltage protection threshold and/or the over-current protection threshold from the charging circuit.

According to another embodiment, provided is a battery charging protection control method for charging a battery of a portable device. The battery charging protection control method includes: generating a power supplier output voltage and a power supplier output current by a power supplier; detecting a battery cell charging voltage by a charging circuit, the battery cell charging voltage being used for charging the battery; dynamically updating an over-voltage protection threshold and/or an over-current protection threshold based on a charging current, a battery cell charging voltage and an equivalent impedance of a charge path by the charging circuit, the charge path being from the power supplier to the battery; and performing over-voltage protection and/or over-current protection by the power supplier based on the over-voltage protection threshold and/or the over-current protection threshold from the charging circuit. The power supplier output current and/or the over-voltage protection threshold and/or the over-current protection threshold are time-varying during the battery is charged.

According to an alternative embodiment, provided is a battery charging system for charging a battery of a portable device. The battery charging system includes: a power supplier, being configured for generating a power supplier output voltage and a power supplier output current; and a charging circuit, coupled to the power supplier for receiving the power supplier output voltage and the power supplier output current from the power supplier, the charging circuit dynamically setting a target value of the power supplier output voltage based on the power supplier output current, a node voltage on a charge path and an equivalent impedance of the charge path, the charge path being from the power supplier to the battery, the charging circuit detecting the node voltage. The power supplier output current and/or the power supplier output current are time-varying during the battery is charged.

According to an alternative embodiment, provided is a battery charging protection control method for charging a battery of a portable device. The battery charging protection control method includes: generating a power supplier output voltage and a power supplier output current by a power supplier; dynamically setting a target value of the power supplier output voltage based on the power supplier output current, a node voltage on a charge path and an equivalent impedance of the charge path by a charging circuit, the charge path being from the power supplier to the battery, the charging circuit detecting the node voltage; and controlling the power supplier in supplying the power supplier output voltage and/or the power supplier output current based on the target value of the power supplier output voltage by the charging circuit. The power supplier output current and/or the power supplier output current are time-varying during the battery is charged.

Figure 1:
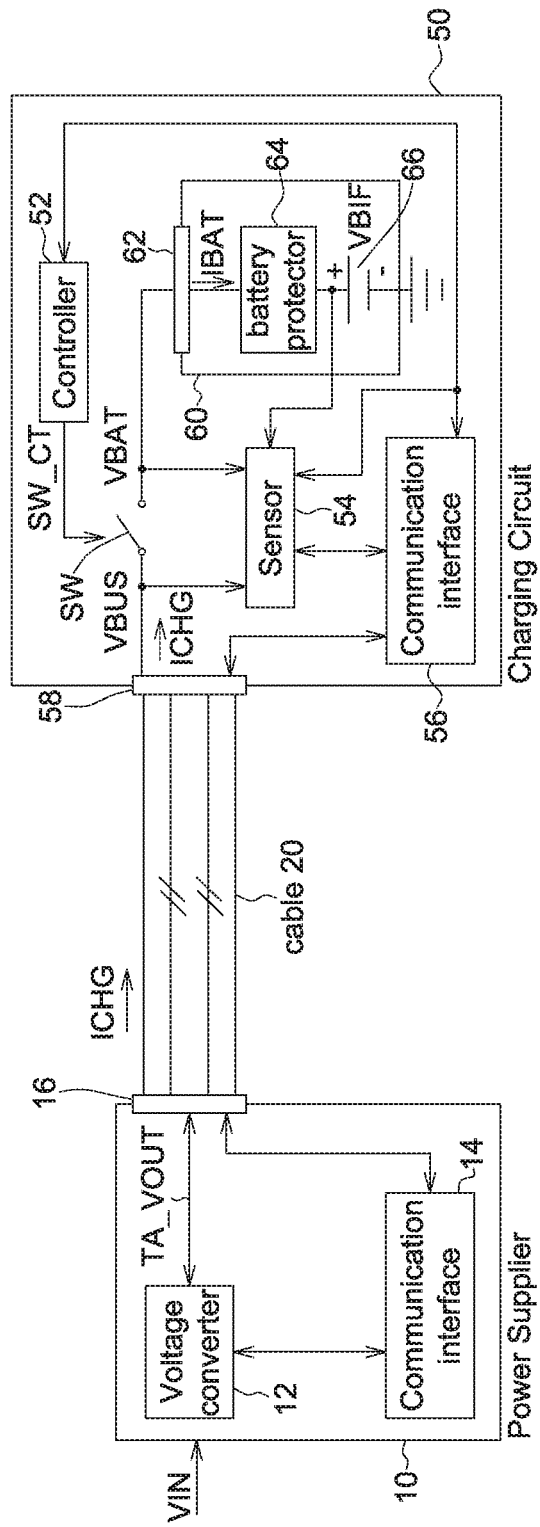
FIG. 1 shows a battery charging system of an exemplary embodiment of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 shows a battery charging system of an exemplary embodiment of the present invention. The battery charging system 100 includes a power supplier 10 and a charging circuit 50. The charging circuit 50 may be a charging circuit of a portable device (for example, a smart phone or a table PC).

A power supplier 10 for charging batteries of the portable device includes a voltage converter 12 and a communication interface 14. The power supplier 10 is coupled to a cable 20 via a connector 16 of the cable 20. The voltage converter 12 may be implemented by, for example but not limited by, a DC-DC converter (such as a buck converter or a buck/boost converter) or an AC-DC converter). The voltage converter 12 is for receiving an input voltage VIN from a voltage source. The input voltage VIN may be an AC input voltage or a DC input voltage and the voltage source may be USB host power source or AC power source. The voltage converter 12 is for outputting a power supplier output voltage TA_VOUT and a power supplier output current ICHG to the charging circuit 50 through the cable 20.

The voltage converter 12 and the communication interface 14 are coupled to the cable 20 through the connector 16. The communication interface 14 is for communicating with a communication interface 56 of the charging circuit 50. The communication interface 14 may receive a target value of the power supplier output voltage, an over-voltage protection (OVP) threshold and an over-current protection (OCP) threshold, which are set by the charging circuit 50, from the charging circuit 50 via the communication interface 56.

The cable 20 is the output cable of the power supplier 10. The cable 20 is coupled to the power supplier 10 via the connector 16 and coupled to the charging circuit 50 via the connector 58.

The power supplier output voltage TA_VOUT and the power supplier output current ICHG generated by the power supplier 10 are delivered to the cable 20 and then to the charging circuit 50, for charging the battery 60 of the portable device.

The charging circuit 50 includes a controller 52, a power switch SW, a sensor 54 and a communication interface 56. The charging circuit 50 is for charging a rechargeable battery 60 of the portable device. The charging circuit 50 is coupled to the cable 20 via a connector 58 of the cable 20.

The controller 52 controls the conduction state of the power switch SW and controls the operations of the charging circuit 50. Further, the controller may set the target value of the power supplier output voltage, over-voltage protection (OVP) thresholds and over-current protection (OCP) thresholds.

When the power switch SW is turned on (i.e. in connection state) under control of the control signal SW_CT from the controller 52, the power supplier output current ICHG is allowed to charge the battery 60. On the contrary, when the power switch SW is turned off (i.e. in disconnection state) under control of the control signal SW_CT from the controller 52, the power supplier output current ICHG is not allowed to charge the battery 60.

The sensor 54 is a voltage sensor and/or a current sensor which is used to sense the battery charging current IBAT, the bus voltage VBUS, the battery cell charging voltage VBAT and the battery voltage VBIF. The sensing results of the sensor 54 are sent to the controller 54.

The battery charging current IBAT and the battery cell charging voltage VBAT are used for charging the battery 60. The bus voltage VBUS is the voltage on the data bus of the charging circuit 50. The battery voltage VBIF is the battery cell voltage of the battery 60.

The charging current IBAT and/or the battery cell charging voltage VBAT will be varied based on timing (i.e. time-varying). Further, the charging current IBAT and/or the battery cell charging voltage VBAT will be varied based on the charging mode (a constant current (CC) mode or a constant voltage (CV) mode) of the charging circuit 50.

The communication interface 56 is communicating with the communication interface 14 of the power supplier 10. In one possible example, the communication between the communication interfaces 56 and 14 includes for example but not limited by, the target value of the power supplier output voltage, over-voltage protection (OVP) thresholds and over-current protection (OCP) thresholds.

The battery 60 may further include a battery connector 62, a battery protector 64 and a battery cell 66. The battery connector 62 is used for connecting the battery 60 to the portable device. The battery protector 64, for example but not limited by, a MOS switch, is for protecting the battery. The battery cell 66 provides battery power to the portable device and is rechargeable by the charging circuit 50 of the portable device.

Figure 2:
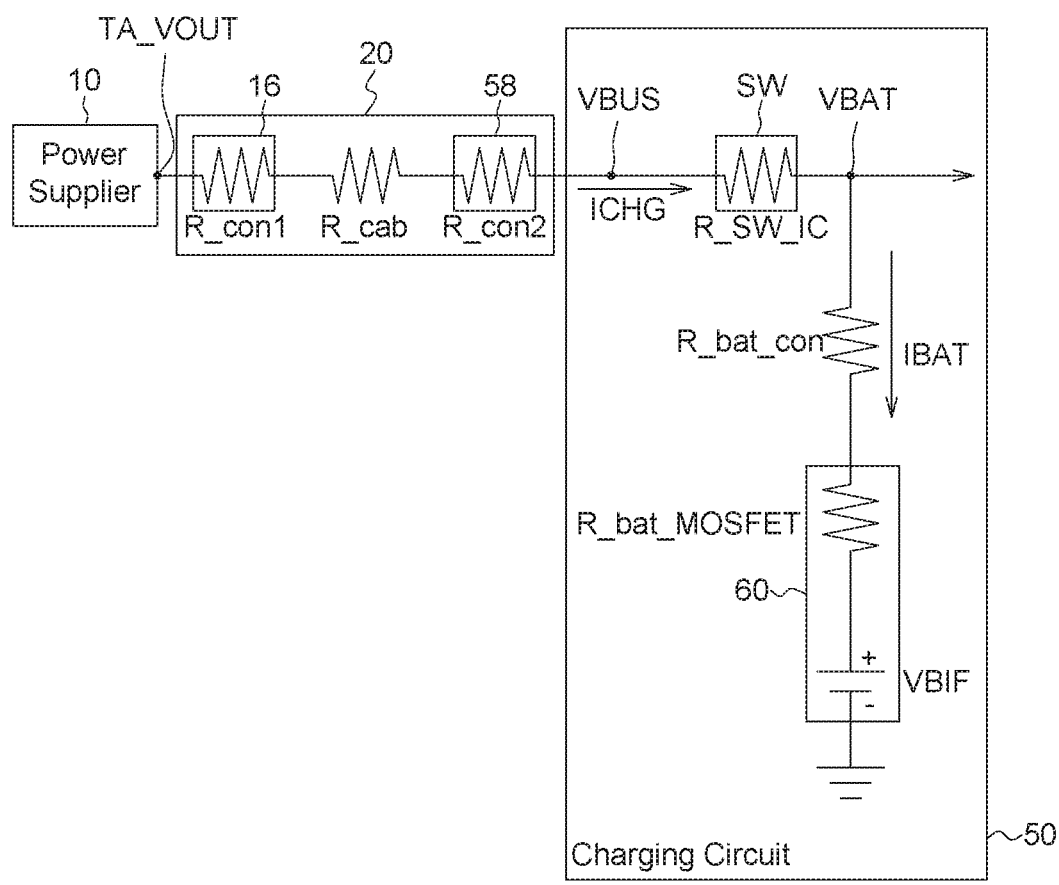
FIG. 2 shows an equivalent impedance diagram of the battery charging system of an exemplary embodiment of the present invention.

Now, refer to FIG. 2 which shows an equivalent impedance diagram of the battery charging system of an exemplary embodiment of the present invention.

As shown in FIG. 2, the connector 16 of the cable 20 has the equivalent impedance R_con1, and the connector 58 of the cable 20 has the equivalent impedance R_con2. The cable 20 further includes a transmission line which has the equivalent impedance R_cab. The power switch SW of the charging circuit 50 has the equivalent impedance R_SW_IC. The connector 62 of the battery 60 has the equivalent impedance R_bat_con and the battery protector 64 of the battery 60 has the equivalent impedance R_bat_MOSFET.

Further, a parameter R_VBAT refers to the equivalent impedance from the node VBAT to the battery cell 66 (i.e. R_VBAT=R_bat_MOSFET+R_bat_con). A parameter R_SW refers to the equivalent impedance from the node VBUS to node VBAT (i.e. R_SW=R_SW_IC). A parameter R_cable refers to the equivalent impedance of the whole cable 20 (i.e. R_cable=R_con1+R_cab+R_con2). How to calculate the equivalent impedance will be described later.

Figure 3:
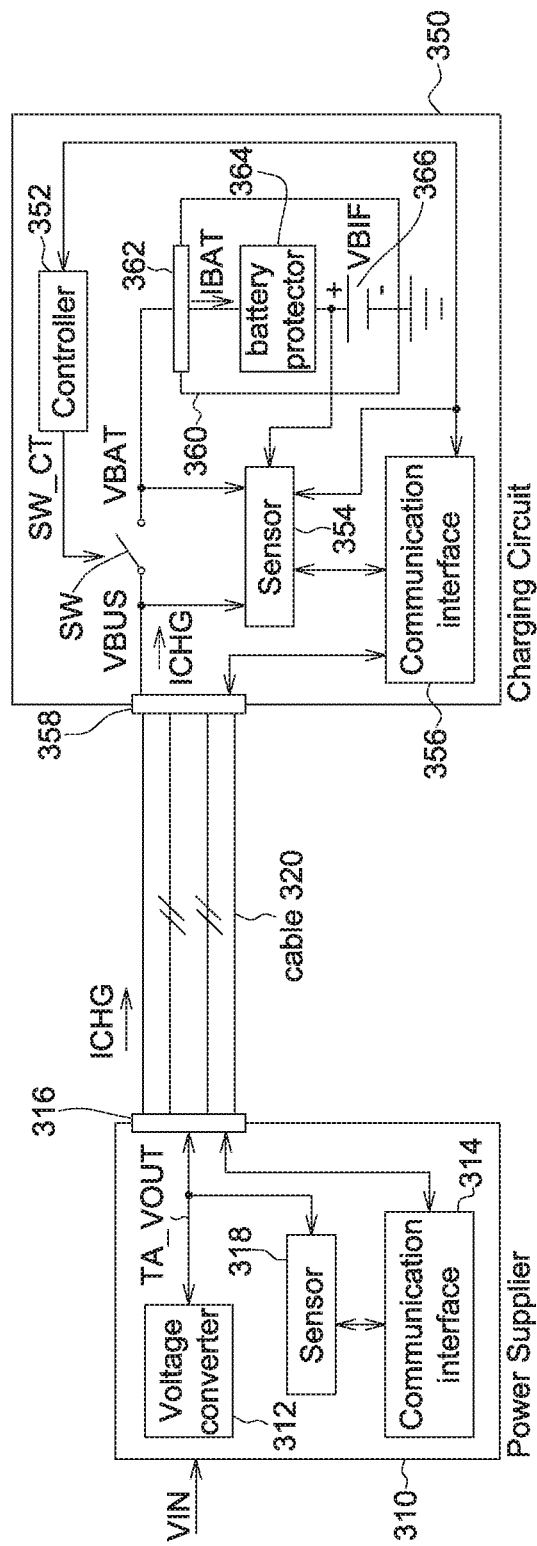
FIG. 3 shows a battery charging system of an exemplary embodiment of the present invention.

FIG. 3 shows a battery charging system of an exemplary embodiment of the present invention. The battery charging system 300 includes a power supplier 310 and a charging circuit 350.

The power supplier 310 for charging batteries of the portable device has a voltage converter 312, a communication interface 314 and a sensor 318. The voltage converter 312 and the communication interface 314 may be the same or similar to the voltage converter 12 and the communication interface 14 of FIG. 1 and thus the details thereof are omitted herein. The cable 320 includes connectors 316 and 358 and a transmission line.

The sensor 318 may sense the power supplier output voltage TA_VOUT and/or the power supplier output current ICHG generated from the voltage converter 312. The sensing results from the sensor 318 may be sent to the charging circuit 350 via the cable 320 and the communication interface 356. That is to say, one of the differences between FIG. 1 and FIG. 3 relies on that, the power supplier 10 of FIG. 1 does not have the function of sensing the power supplier output voltage TA_VOUT and/or the power supplier output current ICHG while the power supplier 310 of FIG. 3 has the function of sensing the power supplier output voltage TA_VOUT and/or the power supplier output current ICHG.

The charging circuit 350 includes a controller 352, a power switch SW, a sensor 354 and a communication interface 356. The charging circuit 350 is for charging a rechargeable battery 360. The rechargeable battery 360 includes a battery connector 362, a battery protector 364 and a battery cell 366. The charging circuit 350 has the same or similar circuit configuration and circuit operations with the charging circuit 50 of FIG. 1.

The impedance calculation of the embodiment of FIG. 1 and FIG. 3 is described. There are at least two impedance calculation implementations in the embodiments of the application. The impedance calculation implementations may be performed and controlled by the controller 52 (352).

In the first impedance calculation implementation, the equivalent impedance R_\MAT, R_SW and R_cable are calculated as follows.

$$R\_VBAT=[(VBAT-VBIF)/IBAT \quad (1)$$

$$R\_SW=(VBUS-VBAT)/ICHG \quad (2)$$

$$R\_cable=(TA\_VOUT-VBUS)/ICHG \quad (3)$$

In FIG. 1, the current ICHG, the voltage values VBAT, VBIF and IBAT may be sensed by the sensor 54 and then sent to the controller 52; and the voltage TA_VOUT may be set and controlled by the controller 52 (the power supplier 10 in FIG. 1 does not include a voltage/current sensor).

In FIG. 3, the voltage values VBAT, VBIF and IBAT may be measured by the sensor 354 and then sent to the controller 352; and the voltage TA_VOUT and the current ICHG may be measured by the sensor 318 and sent to the controller 352.

In the second impedance calculation implementation, the equivalent impedance R_VBAT, R_SW and R_cable are calculated as follows.

$$R\_VBAT=|[(VBAT2-VBAT1)-(VBIF2-VBIF1)]|/|(IBAT2-IBAT1)| \quad (4)$$

$$R\_SW=|[(VBUS2-VBUS1)-(VBAT2-VBAT1)]|/(ICHG2-ICHG1)| \quad (5)$$

$$R\_cable=|[(TA\_VOUT2-TA\_VIUT1)-(VBUS2-VBUS1)]|/(ICHG2-ICHG1)| \quad (6)$$

In the following, the equivalent impedance R_con1, R_con2, R_cab, R_SW_IC, R_bat_con, R_bat_MOSFET, R_VBAT, R_SW and R_cable may be also referred as "the equivalent impedance" of the charge path, wherein the charge path refers to the signal path from the connector 16 (316) of the cable 20 (320) to the battery cell 66 (366) of the battery 60 (360) of the charging circuit 50 (350). Thus, in the following, the voltages (for example, the VBUS, the VBAT) on the charge path may be also referred as the charge path voltage.

One having ordinary skill in the art would understand that the second impedance calculation may be performed after two or more measurements, which are still within the spirit and scope of the application. Also, by the second impedance calculation, the ADC (analog-digital converter) offset, which may occur in converting the analog values (for example but not limited not, VBAT, VBUS, TA_VOUT) into digital values, may be cancelled due to two or more measurements.

The calculated equivalent impedance may be used in setting the OVP thresholds, the OCP thresholds and the target value of the power supplier output voltage TA_VOUT. Details will be described in the following.

Now, how to set the over voltage protection (OVP) thresholds in the embodiments of the application is described.

In FIG. 1 and FIG. 3 of the embodiments of the application, there are three over voltage protection (OVP) thresholds, VBAT_OVP_TH (the OVP threshold of the battery cell charging voltage VBAT), VBUS_OVP_TH (the OVP threshold of the bus voltage VBUS) and TA_VOUT_OVP_TH (the OVP threshold of the power supplier output voltage TA_VOUT).

The above three OVP thresholds may be expressed as function of the battery cell charging voltage VBAT, the equivalent impedance and the power supplier output current ICHG, which are as follows.

$$VBAT\_OVP\_TH=VBAT+f(ICHG,R1) \quad (7)$$

$$VBUS\_OVP\_TH=VBAT+f(ICHG,R2) \quad (8)$$

$$TA\_VOUT\_OVP\_TH=VBAT+f(ICHG,R3) \quad (9)$$

Wherein R_1=R_V_BAT, R2=R_VBAT+R_SW, and R3=R_VBAT+R_SW+R_cable.

In one possible example, the formula (7)-(9) may be expressed as:

$$VBAT\_OVP\_TH=VBAT+f(ICHG,R1)=VBAT+ICHG*R\_VBAT \quad (10)$$

$$VBUS\_OVP\_TH=VBAT+f(ICHG,R2)=VBAT+ICHG*(R\_VBAT+R\_SW) \quad (11)$$

$$TA\_VOUT\_OVP\_TH=VBAT+f(ICHG,R3)=VBAT+ICHG*(R\_VBAT+R\_SW+R\_cable) \quad (12)$$

Of course, the functions of f(ICHG, R) may have other possible implementation and the application is not limited by.

Figure 4:
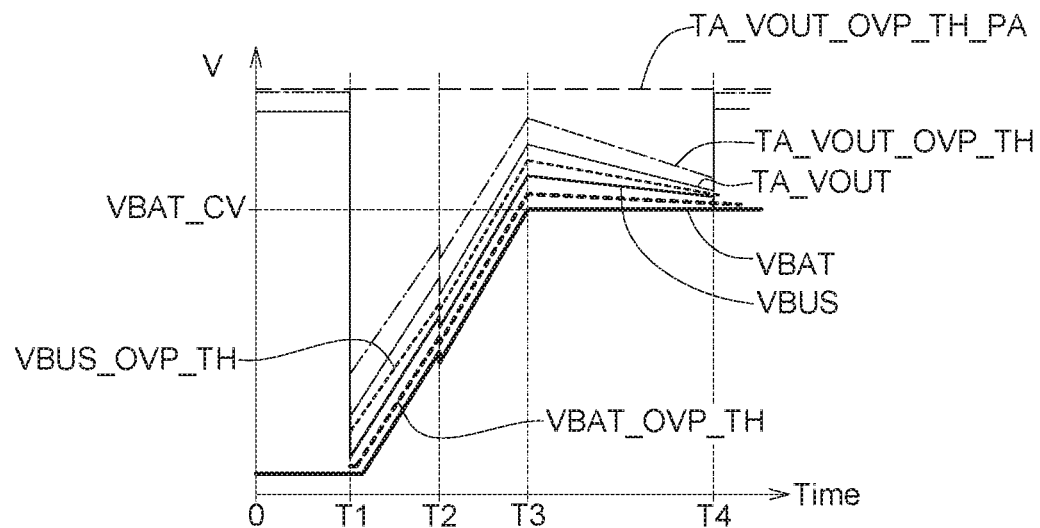
FIG. 4 shows the over-voltage protection (OVP) thresholds of the embodiment of the application.

FIG. 4 shows the OVP thresholds of the embodiment of the application. Before timing T1, the battery voltage VBAT is low. At timing T1, the charging begins and thus the power supplier output voltage TA_VOUT is suddenly dropped by the portable device. During timing T2 and T3, the voltage converter 12 (312) increases the power supplier output voltage TA_VOUT, and accordingly the bus voltage VBUS and the battery cell charging voltage VBAT are increased. As shown in FIG. 4, there are two steps in the CC mode during timing T1-T3.

At timing T3, the controller 52 (352) determines that the battery cell voltage VBIF is quite close to the target value and thus the controller 52 (352) decides to switch the charging circuit 50 into the constant voltage (CV) mode. Thus, after timing T3, the battery cell charging voltage VBAT is kept while the power supplier output voltage TA_VOUT and the bus voltage VBUS are decreased. At timing T4, the controller 52 (352) determines that the charging operation is ended because the battery cell voltage VBIF reaches the target value.

By setting the respective over voltage protection thresholds VBAT_OVP_TH, VBUS_OVP_TH and TA_VOUT_OVP_TH, in the embodiments of the application, the battery cell charging voltage VBAT, the bus voltage VBUS and the power supplier output voltage TA_VOUT will be prevented from being too high to damage the battery 60 (360).

That is to say, by the embodiments of the application, the output node of the power supplier 10 (310) will be protected by the over voltage protection threshold TA_VOUT_OVP_TH. Similarly, the node VBUS (or said, the node where the charging voltage/current entering into the portable device) will be protected by the over voltage protection threshold VBUS_OVP_TH. The node VBAT (i.e. the node at which the charging voltage/current entering into the battery) will be protected by the over voltage protection threshold VBAT_OVP_TH.

Still further, in the embodiments of the application, the battery cell charging voltage VBAT and the power supplier output current ICHG are both time-varying, and thus the respective over voltage protection thresholds VBAT_OVP_TN, VBUS_OVP_TH and TA_VOUT_OVP_TH are time-varying. Besides, the respective over voltage protection thresholds VBAT_OVP_TH, VBUS_OVP_TH and TA_VOUT_OVP_TH may be dynamically adjusted based on the battery cell charging voltage VBAT and the power supplier output current ICHG. Also, the respective over voltage protection thresholds VBUS_OVP_TH and TA_VOUT_OVP_TH are synchronized updated based on the battery cell charging voltage VBAT and the power supplier output current ICHG.

Compared with the prior art, the prior art over voltage protection threshold (for example, TA_VOUT_OVP_TH_PA) is fixed, as shown in FIG. 4. Thus, because the OVP threshold in the embodiments of the application may be dynamically adjusted, the OVP protection in the embodiments of the application will be more flexible.

In one possible example in which the sensor 54 (354) does not have the function of measuring the battery cell voltage VBIF, the equivalent impedance R_VBAT is unknown. Thus, in this example, VBAT_OVP_TH (the OVP threshold of the battery cell charging voltage VBAT), VBUS_OVP_TH (the OVP threshold of the bus voltage VBUS) and TA_VOUT_OVP_TH (the OVP threshold of the power supplier output voltage TA_VOUT) may be expressed as:

$$VBAT\_OVP\_TH = VBAT + a1 \quad (13)$$

$$VBUS\_OVP\_TH = VBAT + ICHG*R\_SW) + a2 \quad (14)$$

$$TA\_VOUT\_OVP\_TH = VBAT + ICHG*(R\_SW + R\_cable) + a3 \quad (15)$$

Wherein a1, a2 and a3, also referred as "over voltage protection threshold margin parameters", may be predetermined positive values (for example but not limited by, 100 mV, which is adjustable if necessary) or may be b1%, b2% or b3% of the battery cell charging voltage VBAT ("b1, b2 and b3" being predetermined positive values and being adjustable if necessary).

Figure 5:
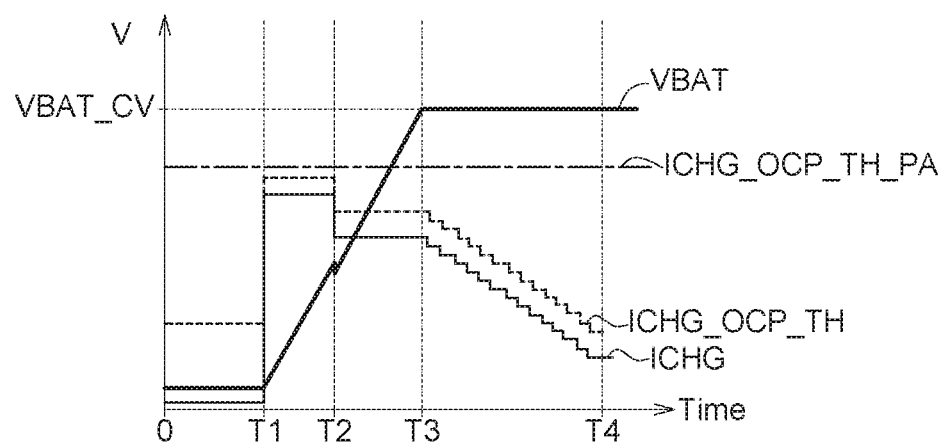
FIG. 5 shows the over current protection (OCP) threshold of FIG. 1 and FIG. 3 of the embodiments of the application.

FIG. 5 shows the setting of the over current protection (OCP) threshold of FIG. 1 and FIG. 3 of the embodiments of the application. As shown in FIG. 5, the power supplier output current ICHG is controlled by the controller 52 (352) of the charging circuit 50 (350) of the portable device, and also, the power supplier output current ICHG is time-varying. Thus, in the embodiments of the application, the controller 52 (352) may set the over current protection (OCP) threshold ICHG_OCP_TH for the power supplier output current ICHG based on the power supplier output voltage ICHG. Thus, the over current protection (OCP) threshold ICHG_OCP_TH is also time-varying and may be dynamically adjusted based on the power supplier output voltage ICHG. Or said, the over current protection threshold ICHG_OCP_TH are synchronized updated based on the power supplier output current ICHG.

In the embodiments of FIG. 1 and FIG. 3, the over current protection threshold ICHG_OCP_TH for the power supplier output current ICHG may be expressed as:

$$ICHG\_OCP\_TH = ICHG + c$$

Wherein "c", also referred as "over current protection threshold margin parameter", may be predetermined positive values (for example but not limited by, 100 mA, which is adjustable if necessary) or may be d % of the power supplier output current ICHG ("d" being a predetermined positive number and being adjustable if necessary).

As shown in FIG. 5, before timing T1, because the charging operation has not started yet, the power supplier output current ICHG is low. At the timing T1, the charging starts (under control of the controller 52 (352)) and thus the power supplier 10 outputs the power supplier output current ICHG to the battery 60 (360) of the charging circuit 50 (350). Thus, during timing T2 to T3 (i.e. CC mode), the power supplier output current ICHG is increase to raise the battery cell charging voltage VBAT. After timing T3 (i.e. CV mode), the power supplier output current ICHG is lowered but the battery cell charging voltage VBAT is almost kept.

In the embodiments of the application, by dynamically setting the over current protection threshold ICHG_OCP_TH, the OCP protection is more flexible, compared with the prior art which has the fixed OCP protection threshold ICHG_OCP_TH_PA (which is shown in FIG. 5).

In the embodiments of the application, in charging, the controller 52 (352) may request the power supplier 10 (310) to generate the power supplier output voltage TA_VOUT. The target value of the power supplier output voltage TA_VOUT is set by the controller 52 (352), and the controller 52 (352) sends the setting values of the power supplier output voltage TA_VOUT via the communication interfaces 14 (314) and 56 (356) to the voltage converter 12 (312) of the power supplier 10 (310). Based on the setting value from the controller 52 (352), the power supplier 10 (310) generates the power supplier output voltage TA_VOUT accordingly.

In setting the value of the power supplier output voltage TA_VOUT, in constant current mode, the setting value of the power supplier output voltage TA_VOUT is increased while in the constant voltage mode, the setting value of the power supplier output voltage TA_VOUT may be fixed. Further, the controller 52 (352) may set the setting value of the power supplier output voltage TA_VOUT based on the voltage, the current and the equivalent impedance on the charge path. For example, in the CC mode, the controller 52 (352) may set the setting value of the power supplier output voltage TA_VOUT as follows:

$$TA\_VOUT \geq VBUS + ICHG*R\_cable \quad (16)$$

$$TA\_VOUT \geq VBAT + ICHG*(R\_cable + R\_SW\_IC) \quad (17)$$

$$TA\_VOUT \geq VBIF + ICHG*(R\_cable + R\_SW\_IC + R\_bat\_con + R\_bat\_MOSFET) \quad (18)$$

Figure 6:
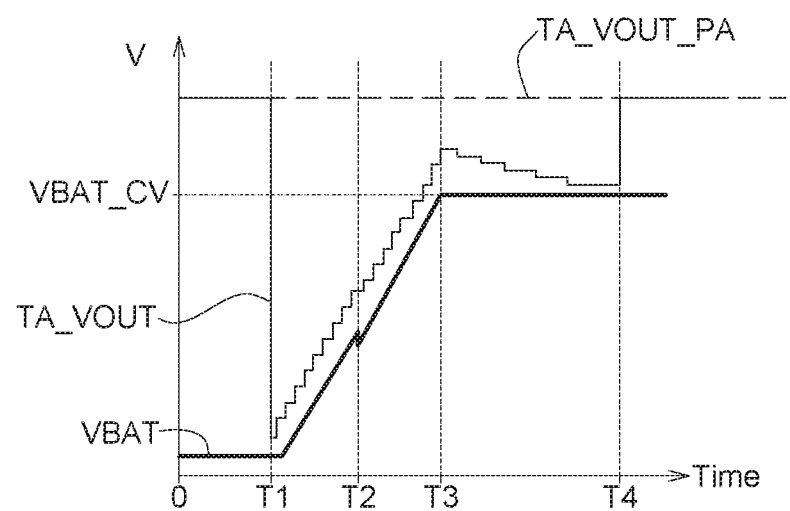
FIG. 6 shows the power supplier output voltage TA_V-OUT of FIG. 1 and FIG. 3 of the embodiments of the application.

FIG. 6 shows the setting of the power supplier output voltage TA_VOUT of FIG. 1 and FIG. 3 of the embodiments of the application. As shown in FIG. 6, the power supplier output current ICHG is controlled by the controller 52 (352) of the charging circuit 50 (350) of the portable device, and also, the power supplier output current ICHG and the power supplier output voltage TA_VOUT are time-varying. Thus, the power supplier output voltage TA_VOUT may be dynamically adjusted based on the power supplier output current ICHG. Or said, the power supplier output voltage TA_VOUT may be synchronized updated based on the power supplier output current ICHG.

In the embodiments of the application, by dynamically adjusting and/or updating the power supplier output voltage TA_VOUT, the voltage generation of the power supplier is more flexible and more power-saving, compared with the prior art which outputs the fixed power supplier output voltage TA_VOUT_PA (which is shown in FIG. 6).

That is to say, in the embodiments of the application, the power supplier output voltage supplied from the power supplier may be controlled by a control signal from the controller of the portable device.

In FIG. 1, the communication interface 56 of the charging circuit 50 may communicate the setting value of the power supplier output voltage TA_VOUT to the communication interface 14 of the power supplier 10.

In FIG. 3, the communication interface 356 of the charging circuit 350 may communicate the setting value of the power supplier output voltage TA_VOUT to the communication interface 314 of the power supplier 10; and the communication interface 314 of the power supplier 10 may communicate the measured values of the power supplier output voltage TA_VOUT and the power supplier output current ICHG to the communication interface 356 of the charging circuit 350. Further, the communication interface 356 of the charging circuit 350 may communicate the setting value of the over-voltage protection threshold TA_V-OUT_TH and/or the over-current protection threshold ICHG_OCP_TH to the communication interface 314 of the power supplier 310, and thus, the power supplier perform over-voltage protection and/or over-current protection based on the over-voltage protection threshold TA_VOUT_TH and/or the over-current protection threshold ICHG_OCP_TH from the controller 52 (352) of the charging circuit 50 (350).

In the above embodiments of the application, the OCP protection threshold and the OVP protection threshold may be dynamically adjusted and/or updated based on the power supplier output voltage and/or the power supplier output current from the power supplier. Thus, in the above embodiments of the application, the OCP protection and the OVP protection are flexible.

Further, in the embodiments of the application, the controller of the portable device controls the setting of the power supplier output voltage based on the battery charging current and/or the power supplier output current and/or the equivalent impedance of the charge path. Thus, in the above embodiments of the application, the power supplier output voltage may be flexibly adjusted and/or dynamically updated.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A battery charging system for charging a battery of a portable device, the battery charging system including:
   a power supplier, being configured for generating a power supplier output voltage and a power supplier output current; and
   a charging circuit, coupled to the power supplier for receiving the power supplier output voltage and the power supplier output current from the power supplier, the charging circuit dynamically updating an over-voltage protection threshold or an over-current protection threshold based on a charging current, a battery cell charging voltage and an equivalent impedance of a charge path, the charge path being from the power supplier to the battery, the charging circuit detecting the battery cell charging voltage which is used for charging the battery,
   wherein at least one of the power supplier output current, the over-voltage protection threshold and the over-current protection threshold is time-varying during the battery charging; and
   the power supplier performs either over-voltage protection or over-current protection based on either the over-voltage protection threshold or the over-current protection threshold from the charging circuit.

2. The battery charging system according to claim 1, wherein
   the power supplier is coupled to a cable, the cable including a first connector coupled to the power supplier and a second connector coupled to the charging circuit, the power supplier having a first communication interface coupled to the cable; and
   the charging circuit includes: a switch, a controller, a second communication interface and a sensor,
   the controller is coupled to the switch, the sensor and the second communication interface,
   the second communication interface is coupled to the cable,
   the switch is coupled to the second connector, for connecting or disconnecting the power supplier output voltage and the power supplier output current into the battery under control of the controller, and
   the sensor is used to a sense a bus voltage and the battery cell charging voltage, the bus voltage being on a first node between the second connector and the switch, the battery cell charging voltage being on a second node between the switch and the battery.

3. The battery charging system according to claim 2, wherein when the sensor has a function of sensing a battery cell voltage inside the battery, the charging circuit is configured to:
   dynamically update a first over-voltage protection threshold for the battery cell charging voltage based on at least one of the battery cell charging voltage, the charging current, and/or a battery protector equivalent impedance of the battery and a battery connector equivalent impedance of the battery.

4. The battery charging system according to claim 3, wherein the charging circuit is configured to:
   dynamically update a second over-voltage protection threshold for the bus voltage based on at least one of the battery cell charging voltage, the charging current, a switch equivalent impedance of the switch, the battery protector equivalent impedance of the battery and the battery connector equivalent impedance of the battery.

5. The battery charging system according to claim 4, wherein the charging circuit is configured to:
   dynamically update a third over-voltage protection threshold for the power supplier output voltage based on at least one of the battery cell charging voltage, the charging current, the switch equivalent impedance of the switch, the battery protector equivalent impedance of the battery, the battery connector equivalent impedance of the battery and a cable equivalent impedance of the cable.

6. The battery charging system according to claim 2, wherein when the sensor does not have a function of sensing a battery cell voltage inside the battery, the charging circuit is configured to:
   dynamically update a first over-voltage protection threshold for the battery cell charging voltage based on the battery cell charging voltage and a first over voltage protection threshold margin parameter, the first over voltage protection threshold margin parameter being a first adjustable predetermined positive value or a first portion of the battery cell charging voltage.

7. The battery charging system according to claim 6, wherein the charging circuit is configured to:
dynamically update a second over-voltage protection threshold for the bus voltage based on at least one of the battery cell charging voltage, the charging current, a switch equivalent impedance of the switch and a second over voltage protection threshold margin parameter, the second over voltage protection threshold margin parameter being a second predetermined positive value which is adjustable or a second portion of the battery cell charging voltage.

8. The battery charging system according to claim 7, wherein the charging circuit is configured to:
dynamically update a third over-voltage protection threshold for the power supplier output voltage based on at least one of the battery cell charging voltage, the charging current, the switch equivalent impedance of the switch, a cable equivalent impedance of the cable and a third over voltage protection threshold margin parameter, the third over voltage protection threshold margin parameter being a third predetermined positive value which is adjustable or being a third portion of the battery cell charging voltage.

9. The battery charging system according to claim 2, wherein the charging circuit is configured to dynamically update the over-current protection threshold for the power supplier output current based on the charging current and an over current protection threshold margin parameter.

10. A battery charging protection control method for charging a battery of a portable device, the battery charging protection control method including:
generating a power supplier output voltage and a power supplier output current by a power supplier;
detecting a battery cell charging voltage by a charging circuit, the battery cell charging voltage being used for charging the battery;
dynamically updating at least one of an over-voltage protection threshold and an over-current protection threshold based on a charging current, a battery cell charging voltage and an equivalent impedance of a charge path by the charging circuit, the charge path being from the power supplier to the battery; and
performing either over-voltage protection or over-current protection by the power supplier based on either the over-voltage protection threshold or the over-current protection threshold from the charging circuit,
wherein at least one of the power supplier output current, the over-voltage protection threshold and the over-current protection threshold is time-varying during the battery charging.

11. The battery charging protection control method according to claim 10, wherein when the charging circuit has a function of sensing a battery cell voltage inside the battery, the dynamically updating step includes:
dynamically updating a first over-voltage protection threshold for the battery cell charging voltage based on at least one of the battery cell charging voltage, the charging current, a battery protector equivalent impedance of the battery and a battery connector equivalent impedance of the battery.

12. The battery charging protection control method according to claim 11, wherein the dynamically updating step further includes:
dynamically updating a second over-voltage protection threshold for the bus voltage based on at least one of the battery cell charging voltage, the charging current, a switch equivalent impedance of the switch, the battery protector equivalent impedance of the battery and the battery connector equivalent impedance of the battery.

13. The battery charging protection control method according to claim 12, wherein the dynamically updating step further includes:
dynamically updating a third over-voltage protection threshold for the power supplier output voltage based on at least one of the battery cell charging voltage, the charging current, the switch equivalent impedance of the switch, the battery protector equivalent impedance of the battery, the battery connector equivalent impedance of the battery and a cable equivalent impedance of the cable.

14. The battery charging protection control method according to claim 10, wherein when the sensor does not have a function of sensing a battery cell voltage inside the battery, the dynamically updating step includes:
dynamically updating a first over-voltage protection threshold for the battery cell charging voltage based on the battery cell charging voltage and a first over voltage protection threshold margin parameter, the first over voltage protection threshold margin parameter being a first adjustable predetermined positive value or a first portion of the battery cell charging voltage.

15. The battery charging protection control method according to claim 14, wherein the dynamically updating step includes:
dynamically updating a second over-voltage protection threshold for the bus voltage based on at least one of the battery cell charging voltage, the charging current, a switch equivalent impedance of the switch and a second over voltage protection threshold margin parameter, the second over voltage protection threshold margin parameter being a second adjustable predetermined positive value or a second portion of the battery cell charging voltage.

16. The battery charging protection control method according to claim 15, wherein the dynamically updating step includes:
dynamically updating a third over-voltage protection threshold for the power supplier output voltage based on at least one of the battery cell charging voltage, the charging current, the switch equivalent impedance of the switch, a cable equivalent impedance of the cable and a third over voltage protection threshold margin parameter, the third over voltage protection threshold margin parameter being a third adjustable predetermined positive value or a third portion of the battery cell charging voltage.

17. The battery charging protection control method according to claim 10, wherein the dynamically updating step includes:
dynamically updating the over-current protection threshold for the power supplier output current based on the charging current and an over current protection threshold margin parameter.

18. A battery charging system for charging a battery of a portable device, the battery charging system including:
a power supplier, being configured for generating a power supplier output voltage and a power supplier output current; and
a charging circuit, coupled to the power supplier for receiving the power supplier output voltage and the power supplier output current from the power supplier, the charging circuit dynamically setting a target value of the power supplier output voltage based on the power supplier output current, a node voltage on a charge path and an equivalent impedance of the charge path, the charge path being from the power supplier to the battery, the charging circuit detecting the node voltage, wherein at least one of the power supplier output voltage and the power supplier output current is time-varying during the battery charging.

19. The battery charging system according to claim 18, wherein the charging circuit is configured to:
dynamically set the target value of the power supplier output voltage based on at least one of a bus voltage, the power supplier output current and a cable equivalent impedance of the cable.

20. The battery charging system according to claim 18, wherein the charging circuit is configured to:
dynamically set the target value of the power supplier output voltage based on at least one of a battery cell charging voltage, the power supplier output current, a cable equivalent impedance of the cable and a switch equivalent impedance of the switch.

21. The battery charging system according to claim 18, wherein the charging circuit is configured to:
dynamically set the target value of the power supplier output voltage based on at least one of a battery cell voltage of the battery, the power supplier output current, a cable equivalent impedance of the cable, a switch equivalent impedance of the switch, a battery protector equivalent impedance of the battery and a battery connector equivalent impedance of the battery.

22. A battery charging protection control method for charging a battery of a portable device, the battery charging protection control method including:
generating a power supplier output voltage and a power supplier output current by a power supplier;
dynamically setting a target value of the power supplier output voltage based on the power supplier output current, a node voltage on a charge path and an equivalent impedance of the charge path by a charging circuit, the charge path being from the power supplier to the battery, the charging circuit detecting the node voltage; and
controlling the power supplier in supplying at least one of the power supplier output voltage and the power supplier output current based on the target value of the power supplier output voltage by the charging circuit,
wherein at least one of the power supplier output voltage and the power supplier output current is time-varying during the battery charging.

23. The battery charging protection control method according to claim 22, wherein the dynamically setting step includes:
dynamically setting the target value of the power supplier output voltage based on at least one of a bus voltage, the power supplier output current and a cable equivalent impedance of the cable.

24. The battery charging protection control method according to claim 22, wherein the dynamically setting step includes:
dynamically setting the target value of the power supplier output voltage based on at least one of a battery cell charging voltage, the power supplier output current, a cable equivalent impedance of the cable and a switch equivalent impedance of the switch.

25. The battery charging protection control method according to claim 22, wherein the dynamically setting step includes:
dynamically setting the target value of the power supplier output voltage based on at least one of a battery cell voltage of the battery, the power supplier output current, a cable equivalent impedance of the cable, a switch equivalent impedance of the switch, a battery protector equivalent impedance of the battery and a battery connector equivalent impedance of the battery.

* * * * *